United States Patent [19]

Ohmura et al.

[11] Patent Number: 4,848,272
[45] Date of Patent: Jul. 18, 1989

[54] APPARATUS FOR FORMING THIN FILMS

[75] Inventors: Masanori Ohmura; Hiroshi Sakama; Kenji Araki; Hiroshi Kamio; Yoshinobu Shima, all of Tokyo, Japan

[73] Assignee: Nippon Kokan Kabushiki Kaisha, Tokyo, Japan

[21] Appl. No.: 162,064

[22] Filed: Feb. 29, 1988

[30] Foreign Application Priority Data

Dec. 9, 1986 [JP] Japan .................. 62-291468

[51] Int. Cl.$^4$ ............................. C23C 16/46
[52] U.S. Cl. .................. 118/725; 118/501; 118/730
[58] Field of Search ............. 118/730, 723, 725, 50.1, 118/728

[56] References Cited

U.S. PATENT DOCUMENTS

| | | | |
|---|---|---|---|
| 3,594,227 | 7/1971 | Oswald | 437/172 |
| 4,597,986 | 7/1986 | Scapple et al. | 427/53.1 |
| 4,632,060 | 12/1986 | Goto et al. | 118/730 |
| 4,694,779 | 9/1987 | Hammond et al. | 118/730 |

FOREIGN PATENT DOCUMENTS

| | | |
|---|---|---|
| 147967 | 7/1985 | European Pat. Off. |
| 223629 | 5/1987 | European Pat. Off. |
| 2168080 | 6/1986 | United Kingdom |

OTHER PUBLICATIONS

Patent Abstracts of Japan, vol. 3, No. 86, (E—125), 24th Jul. 1979, p. 50E 125; JP—A—54—64977 (Nippon Denki K.K.), 25th May, 1979.
Patent Abstracts of Japan, vol. 8, No. 138, (C—231) [1575], 27th Jun., 1984; JP—A—59—50092, (Toshiba Kikai K.K.), 22nd Mar., 1984.

*Primary Examiner*—Evan Lawrence
*Attorney, Agent, or Firm*—Frishauf, Holtz, Goodman & Woodward

[57] ABSTRACT

An apparatus for forming epitaxial layers, comprises a first susceptor disposed in a reaction furnace and having an outer periphery constituted by a heat reflection material and capable of supporting a plurality of semiconductor wafers, a second susceptor disposed coaxially with the first susceptor such as to surround the first susceptor at a predetermined space therefrom and having an inner periphery constituted by a heat reflection material and capable of supporting a plurality of semiconductor wafers such that these semiconductor wafers face the semiconductor wafers supported by the first susceptor, and a pair of heat reflection members disposed in the reaction furnace between the outer periphery of the first susceptor and the inner periphery of the second susceptor. The first and second susceptors are rotated in mutually opposite directions about a common vertical axis during an epitaxial growing process.

9 Claims, 1 Drawing Sheet

APPARATUS FOR FORMING THIN FILMS

BACKGROUND OF THE INVENTION

1. Field of the Invention

This invention relates to an apparatus for formng thin films such as a barrel type epitaxial growth apparatus used for manufacturing ultra LSIs.

2. Description of the Related Art

With the recent trend for increasing integration density and reducing the size of semiconductor integrated circuits, it is a frequently used practice to form an epitaxial layer by means of epitaxial crystal growth on a semiconductor wafer for MOS, for instance. There is also a trend that the thickness of the epitaxial layer is reduced with increasing size of the semiconductor substrate. Reaction apparatus for the epitaxial growth are roughly classified into three types, i.e., horizontal reaction tube type, vertical bell jar type and barrel type. Further, there is a recently developed hot wall type, which is a modification of the reduced pressure CVD. In these reaction apparatuses, a susceptor for supporting a plurality of wafers is set in a reaction furnace maintained under a high temperature condition, and in this state a reaction fluid, which is a gas such as silicon tetrachloride (SiCl$_4$) or silane, is supplied into the reaction furnace, whereby an epitaxial layer is formed on each wafer surface.

In a modification of the barrel type epitaxial growth apparatus, each wfaer is heated from two sides for obtaining uniform heating. In this case, the wafer is heated from the back side by a high frequency induction coil through a susceptor, while the bell jar surface is provided with a metal coating film to radiate heat toward the wafer surface.

In order to obtain a high quality epitaxial film, it is important to maintain the thickness and resistance of the film uniform. In the barrel type apparatus noted above, however, it is impossible to control the temperature of each wafer or the temperature of each portion of a wafer constituting each chip uniformly, and non-uniform temperature distribution results. The reason for this is as follows. With the reaction fluid progressively supplied to and discharged from the reaction furnace under a high temperature condition, the temperature of the fluid, i.e., silane, and the molar concentration of a silicon-containing gas and a dopant gas are not the same in the neighborhood of the inlet and outlet of the furnace; that is, the temperature and molar concentration vary depending on the location of the wafer. Further, silane does not flow uniformly through the reaction furnace, but will sometimes form a vortex flow. In such a case, variations of temperature and molar concentration of gas will occur not with different wafers but with different portions of the same wafer. Still further, the amount of heat radiated from the metal coating film formed on the bell jar is reduced with the progress of the epitaxial growth, thus resulting in non-uniform temperature distribution. Furthermore, with the repetition of the epitaxial growth process the metal coating film is deteriorated due to thermal fatigue. Non-uniform temperature distribution is further liable to occur depending on the amount of the supplied reaction fluid.

Further, in considering the amount of processing applied to wafers, with increase of the wafer size the amount processed per cycle is reduced, leading to a cost increase per wafer.

SUMMARY OF THE INVENTION

An object of the invention is to provide an apparatus for forming thin films, which permits a high quality thin film having uniform thickness and resistance to be formed on a plurality of semiconductor wafers or like objects in a single process.

This and other objects of the invention are attained with an apparatus for forming thin films. The apparatus includes a reaction furnace. A first susceptor is disposed in the reaction furnace, and it has an outer periphery capable of supporting a plurality of objects to be subjected to a film formation process. A second susceptor is disposed in the reaction furnace such as to surround the first susceptor at a predetermined space therefrom, and it has an inner periphery capable of supporting the plurality of objects such that these objects face such objects supported by the first susceptor. A rotating means is provided for causing rotation of the first and second susceptors relative to each other. A reaction fluid is supplied to the space in the reaction furnace between the outer periphery of the first susceptor and the inner periphery of the second susceptor. The reaction fluid is exhausted from the space in the reaction furnace between the outer periphery of the first susceptor and the inner periphery of the second susceptor.

Another aspect of the invention is directed to an apparatus for forming thin films. The apparatus comprises a reaction furnace. A first susceptor is disposed in the reaction furnace. It has an outer periphery constituted by a heat reflection material, and is capable of supporting a plurality of semiconductor wafers. A second susceptor is disposed coaxially with the first susceptor in the reaction furnace such as to surround the first susceptor at a predetermined space therefrom. It has an inner periphery constituted by a heat reflection material, and it is capable of supporting a plurality of semiconductor wafers such that these semiconductor wafers face the semiconductor wafers supported by the first susceptor. A pair of heat reflection members is disposed in the reaction furnace between the outer periphery of the first susceptor and the inner periphery of the second susceptor. A rotating means causes rotation of the first and second susceptors relative to each other. A fluid supply means supplies a reaction fluid to the space in the reaction furnace between the outer periphery of the first susceptor and the inner periphery of the second susceptor. A fluid exhausting means exhausts the reaction fluid from the space in the reaction furnace between the outer periphery of the first susceptor and the inner periphery of the second susceptor. A heating means is provided for heating the reaction fluid in the reaction furance.

DETAILED DESCRIPTION OF THE PREFERRED EMBODIMENT

Now, an embodiment of the thin film formation apparatus according to the invention applied to a barrel type epitaxial growth apparatus for forming an epitaxial layer on silicon wafers, will be described.

Figure 1:
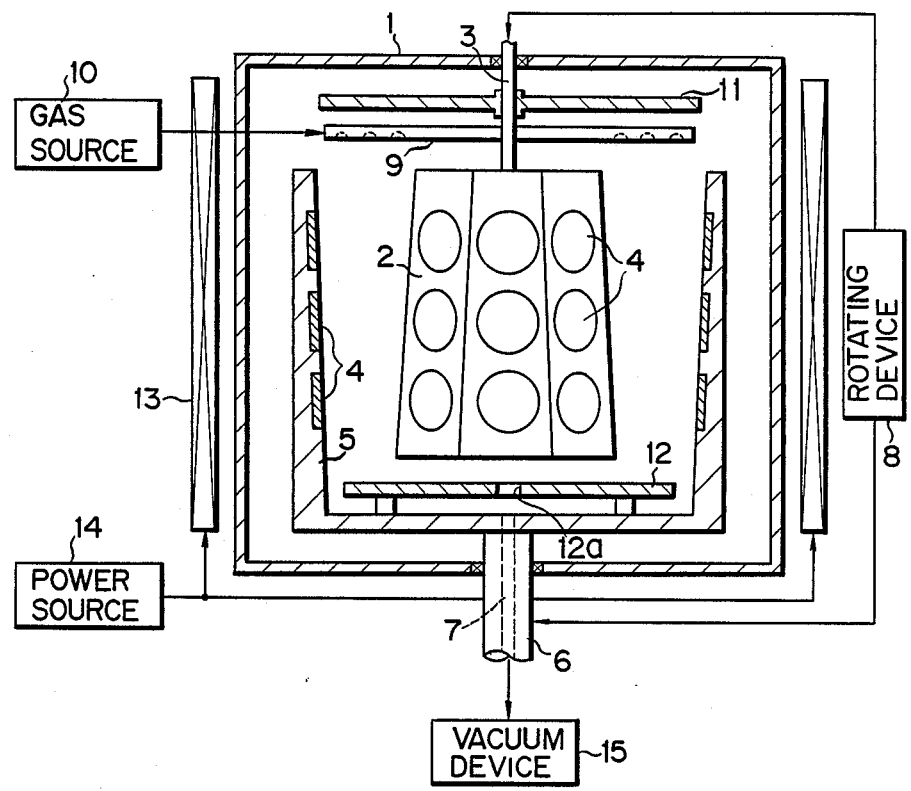
FIG. 1 is a schematic sectional view showing one embodiment of the apparatus for forming thin films according to the invention.

FIG. 1 shows the embodiment. Reference numeral 1 designates a reaction furnace or bell jar, which is a hollow cylindrical or oval member made of a heat-resistant material, e.g., quartz. In bell jar 1, first and second susceptors 2 and 5 are coaxially accommodated. First susceptor 2 has a substantially hexagonal sectional profile. Shaft 3 projects from the top of the center of this susceptor. Shaft 3 extends coaxially with susceptor 2 and penetrates the top center of bell jar 1 to the outside. It is rotatably supported by a bearing provided in the top wall of the bell jar. Susceptor 2 accurately has a hexagonal frusto-conical profile. Its six side surfaces are slightly inclined such that they flare outwardly in the downward direction. Each flat side surface is formed with circular wafer reception recesses. The number and locations of the wafer reception recesses can be suitably selected. In this embodiment, each side surface is formed with three vertically uniformly spaced-apart wafer reception recesses, that is, susceptor 2 has a total of 18 wafer reception recesses. The wafer reception recess preferably has a diameter slightly greater than the outer diameter of the wafer.

Second susceptor 5 has a hollow cylindrical shape closed at the bottom. First susceptor 2 is coaxially disposed in second susceptor 5. The inner surface of second susceptor 5 consists of six flat surfaces closely arranged side by side in the circumferential direction. These flat surfaces are slightly inclined such that they flare inwardly as one goes downwards. Each of the six inner surfaces is formed with three circular wafer reception recesses. It is to be understood that the direction of inclination of the side surfaces of first susceptor 2 is opposite to the direction of inclination of the inner side surfaces of second susceptor 5. The inclination of the peripheral surfaces with respect to a vertical axis is not essential but desired in order to let the susceptor support objects to be subjected to a film formation process, such as wafers 4, satisfactorily with a simple construction. Hollow shaft 6 extends from the center of the bottom of second susceptor 5. Shaft 6 extends coaxially with susceptor 5 and penetrates the center of the bottom of bell jar 1. It is rotatably supported in the bell jar via a bearing provided in the bottom wall of the bell jar. Shaft 6 is coupled to and rotated by rotating device 8 which is disposed outside bell jar 1. Rotating device 8 is of a well-known structure, for instance consisting of a motor and a gear train. It may rotate shafts 3 and 6 in opposite directions, or it may rotate these shafts in the same direction but at different speeds. As a further alternative, it may rotate only one of shafts 3 and 6.

Gas supply ductline or nozzle unit 9 is disposed in an upper portion of the interior of bell jar 1 for supplying a reaction gas, i.e., silicon tetrachloride gas. The gas supply ductline has a number of gas jet ports which are disposed above the space between susceptors 2 and 5. Gas supply ductline 9 is connected to gas source 10, which is disposed outside bell jar 1, and from which the reaction gas is supplied at a controlled rate.

Upper shaft 3 is provided with coaxial reflector 11 secured to it. Reflector 11 is disk-like in shape and made of a material capable of reflecting radiation heat, e.g., stainless steel. Second reflector 12 is secured to the bottom wall of second susceptor 5 such that it is spaced apart a predetermined distance from the bottom wall upper surface. It has central through hole 12a, through which the reaction gas is passed. Between first and second susceptors 2 and 5, there is formed an epitaxial growth space, which has its top and bottom defined by reflectors 11 and 12 and its periphery by first and second susceptors 2 and 5 and wafers supported thereby, that is, which is defined by radiation heat reflection surfaces.

Exhausting tube 7 extends through lower shaft 6. The exhausting tube has one end open at the center of the upper surface of the bottom wall of second susceptor 5 and the other end connected to vacuum device 15. Unnecessary gas is exhausted from the epitaxial growth space through the space surrounding second reflector 12 and central through hole 12a formed therein and then through exhausting tube 7.

High frequency induction heating coil 13 is disposed such that it surrounds bell jar 1. It is connected to power source 14 and supplied with predetermined power therefrom to heat the epitaxial growth space.

Now, the operation of the apparatus having the above construction will be described in connection with a case of forming an epitaxial growth layer of silicon on wafers 4.

First, wafers 4 are set in the recesses of first and second susceptors 2 and 5, and then these susceptors are rotated in opposite directions. At the same time, coil 13 is energized to heat the interior of bell jar 1 to a predetermined temperature. Further, silane as reaction gas is supplied from gas source 10 through gas supply ductline 9 into the epitaxial growth space in bell jar 1. As a result, the reaction gas is decomposed in the space, and silicon epitaxial layer is formed on silicon wafers 4. The excess of the decomposed gas is exhausted through exhausting tube 7 to the outside of bell jar 1. Since the surface of wafers 4 is a mirror surface, during the epitaxial growth the opposed wafers function as radiation heat source like opposed susceptors 2 and 5. Thus, uniform temperature distribution can be obtained among wafers 4 supported by susceptors 2 and 5. Further, since susceptors 2 and 5 are rotating in a face-to-face relation to each other, the reaction gas flowing through between these susceptors is agitated to be brought uniformly to individual wafers 4. With such uniformalization of the temperature and reaction gas flow, an epitaxial layer can be obtained which has uniform thickness and resistance. Further, since two susceptors 2 and 5 are used, it is possible to form an epitaxial layer on a number of wafers at a time.

Figure 2:
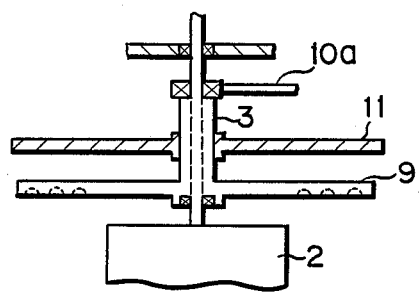
FIG. 2 is a sectional view showing a modification of a gas supply ductline in the same apparatus.

In the above embodiment, gas supply ductline 9 has been stationary. However, it is possible to use a gas supply ductline which is rotatable together with susceptor 2, as shown in FIG. 2. In this modification, shaft 3 is hollow and integral with gas supply ductline 9 such that the former and latter communicate with each other. Shaft 3 is connected via a rotary fluid joint to pipeline 10a from the gas source. Thus, the reaction gas is supplied from rotating supply gas ductline to the epitaxial gas growth space.

Figure 3:
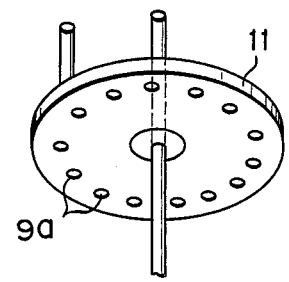
FIG. 3 is a perspective view showing another modification of the gas supply ductline in the same apparatus.

FIG. 3 shows a different modification of the supply gas ductline. In this case, supply gas ductline is formed in reflector 11. More specifically, reflector 11 is hollow, and its lower surface is formed with a plurality of gas jet ports 9a. A pipeline connected to the gas source projects from the top surface of reflector 11.

In the above embodiment, the susceptor surfaces for supporting wafers were slightly inclined so that they can support wafers during rotation. However, this wafer support means is by no means limitative. For example, the susceptor surfaces may be formed with ridges in lieu of the recesses so as to support the wafer periphery with the ridge. Further, the first susceptor is not limited to be of the hexagonal cylindrical or hexagonal conical shape, but it may be of any other suitable shape so long as it can support wafers on its periphery. For example, a polygonal susceptor other than hexagonal may be used. Further, the susceptor surfaces need not be flat, if means for supporting wafers are provided. The second susceptor, like the first susceptor, is subject to various modifications. For example, if the upper surface of the bottom wall of the second susceptor is formed as a reflecting surface, the second reflector may be dispensed with. Instead of using a high frequency induction heating coil, electric-resisting means and a lamp may be used for heating susceptors.

What is claimed is:

1. An apparatus for forming thin films, comprising:
a reaction furnace;
a first susceptor disposed in said reaction furnace and having an outer periphery capable of supporting a plurality of objects to be subjected to a film formation process;
a second susceptor disposed in said reaction furnace such as to surround said first susceptor at a predetermined space therefrom and having an inner periphery capable of supporting said plurality of objects such that these objects face such objects supported by said first susceptor;
rotating means for causing rotation of said first and second susceptors relative to each other;
means for supplying a reaction fluid to the space in said reaction furnace between the outer periphery of said first susceptor and the inner periphery of said second susceptor; and
means for exhausting the reaction fluid from the space in said reaction furnace between the outer periphery of said first susceptor and the inner periphery of said second susceptor.

2. The apparatus according to claim 1, wherein the outer periphery of said first susceptor has a plurality of flat surfaces arranged side by side in the peripheral direction, each of said flat surfaces being capable of supporting at least one of said plurality of objects.

3. The apparatus according to claim 2, wherein the inner periphery of said second susceptor has a plurality of flat surfaces arranged side by side in the circumferential direction, each of said flat surfaces being capable of supporting at least one of said plurality of objects.

4. The apparatus according to claim 3, wherein the flat surfaces of said first and second susceptors have recesses for receiving, respectively, said plurality of objects therein.

5. The apparatus according to claim 4, wherein said first and second susceptors have respective coaxial vertical shafts and are rotated in mutually opposite directions.

6. The apparatus according to claim 5, wherein the outer periphery of said first susceptor and inner periphery of said second susceptor are inclined with respect to said shafts.

7. An apparatus for forming thin films, comprising:
a reaction furnace;
a first susceptor disposed in said reaction furnace and having an outer periphery constituted by a heat reflection material and capable of supporting a plurality of semiconductor wafers;
a second susceptor disposed coaxially with said first susceptor in said reaction furance such as to surround said first susceptor at a predetermined space therefrom and having an inner periphery constituted by a heat reflection material and capable of supporting a plurality of semiconductor wafers such that these semiconductor wafers face the semiconductor wafers supported by said first susceptor;
a pair of heat reflection members disposed in said reaction furnace between the outer periphery of said first susceptor and the inner periphery of said second susceptor;
rotating means for causing rotation of said first and second susceptors relative to each other;
fluid supply means for supplying a reaction fluid to the space in said reaction furnace between the outer periphery of said first susceptor and the inner periphery of said second susceptor;
fluid exhausting means for exhausting the reaction fluid from the space in said reaction furnace between the outer periphery of said first susceptor and the inner periphery of said second susceptor; and
heating means for heating the reaction fluid in said reaction furnace.

8. The apparatus according to claim 7, wherein said heat reflection members are provided on and rotatable with said respective first and second susceptors.

9. The apparatus according to claim 8, wherein said reaction fluid supply means is secured to said first susceptor for rotation in unison with said first susceptor.

* * * * *

UNITED STATES PATENT AND TRADEMARK OFFICE
CERTIFICATE OF CORRECTION

PATENT NO. : 4,848,272
DATED : July 18, 1989
INVENTOR(S) : Ohmura et al

It is certified that error appears in the above-identified patent and that said Letters Patent is hereby corrected as shown below:

In the title page, under "Foreign Application Priority Data", delete "Dec. 9, 1986 [JP] Japan.........62-291468".

Signed and Sealed this

Nineteenth Day of June, 1990

Attest:

HARRY F. MANBECK, JR.

*Attesting Officer*      *Commissioner of Patents and Trademarks*